(12) United States Patent
Lu

(10) Patent No.: US 12,380,947 B2
(45) Date of Patent: *Aug. 5, 2025

(54) SYSTEMS AND METHODS TO STORE MULTI-LEVEL DATA

(71) Applicant: Taiwan Semiconductor Manufacturing Company, Ltd., Hsinchu (TW)

(72) Inventor: Shih-Lien Linus Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/621,855

(22) Filed: Mar. 29, 2024

(65) Prior Publication Data

US 2024/0242763 A1   Jul. 18, 2024

Related U.S. Application Data

(63) Continuation of application No. 17/876,149, filed on Jul. 28, 2022, now Pat. No. 11,948,628, which is a
(Continued)

(51) Int. Cl.
*G11C 7/10* (2006.01)
*G11C 11/56* (2006.01)

(52) U.S. Cl.
CPC ............ *G11C 11/56* (2013.01); *G11C 7/1069* (2013.01); *G11C 7/1096* (2013.01)

(58) Field of Classification Search
CPC .................................................. G11C 7/1096
(Continued)

(56) References Cited

U.S. PATENT DOCUMENTS 11,437,092 B2    9/2022  Lu
11,948,628 B2 *  4/2024  Lu ..................... G11C 13/0002
(Continued)

FOREIGN PATENT DOCUMENTS

TW    200727300 A    7/2007
TW    200842880 A    11/2008
(Continued)

OTHER PUBLICATIONS

First Taiwan Office Action on TW Appl. Ser. No. 110117196 dated Apr. 7, 2022 (4 pages).
(Continued)

*Primary Examiner* — Hoai V Ho
(74) *Attorney, Agent, or Firm* — FOLEY & LARDNER LLP

(57) ABSTRACT

Disclosed herein are related to a memory system and a method of operating the memory system. In one aspect, resistances of a first memory cell, a second memory cell, a third memory cell, and a fourth memory cell are individually set. In one aspect, the first memory cell and the second memory cell are coupled to each other in series between a first line and a second line, and the third memory cell and the fourth memory cell are coupled to each other in series between the second line and a third line. In one aspect, current through the second line according to a parallel resistance of i) a first series resistance of the first memory cell and the second memory cell, and ii) a second series resistance of the third memory cell and the fourth memory cell is sensed. According to the sensed current, multi-level data can be read.

20 Claims, 14 Drawing Sheets

Related U.S. Application Data continuation of application No. 17/203,890, filed on Mar. 17, 2021, now Pat. No. 11,437,092.

(60) Provisional application No. 63/030,643, filed on May 27, 2020.

(58) Field of Classification Search
USPC .................................................... 356/189.16
See application file for complete search history.

(56) References Cited

U.S. PATENT DOCUMENTS

| | | |
|---|---|---|
| 2008/0247232 A1 | 10/2008 | Iwata et al. |
| 2010/0046270 A1 | 2/2010 | Katoh et al. |
| 2010/0202185 A1 | 8/2010 | Katoh et al. |
| 2017/0140807 A1 | 5/2017 | Sun et al. |
| 2018/0349762 A1 | 12/2018 | Lee |
| 2019/0019538 A1 | 1/2019 | Li et al. |
| 2019/0019564 A1 | 1/2019 | Li et al. |

FOREIGN PATENT DOCUMENTS

| | | |
|---|---|---|
| TW | 201013675 A | 4/2010 |
| TW | 201203258 A | 1/2012 |
| TW | 201303872 A | 1/2013 |
| TW | 201447572 A | 12/2014 |

OTHER PUBLICATIONS

Non-Final Office Action on U.S. Appl. No. 17/203,890 DTD Feb. 8, 2022.

Non-Final Office Action on U.S. Appl. No. 17/876,149 DTD Aug. 8, 2023.

Notice of Allowance on U.S. Appl. No. 17/203,890 DTD May 17, 2022.

Notice of Allowance on U.S. Appl. No. 17/876,149 DTD Dec. 7, 2023.

\* cited by examiner

SYSTEMS AND METHODS TO STORE MULTI-LEVEL DATA

CROSS-REFERENCE TO RELATED APPLICATIONS

This application is a continuation of U.S. patent application Ser. No. 17/876,149, filed Jul. 28, 2022, which is a continuation of U.S. patent application Ser. No. 17/203,890, filed Mar. 17, 2021, which claims priority to and the benefit of U.S. Provisional Application No. 63/030,643, filed May 27, 2020, all of which are incorporated herein by references in their entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
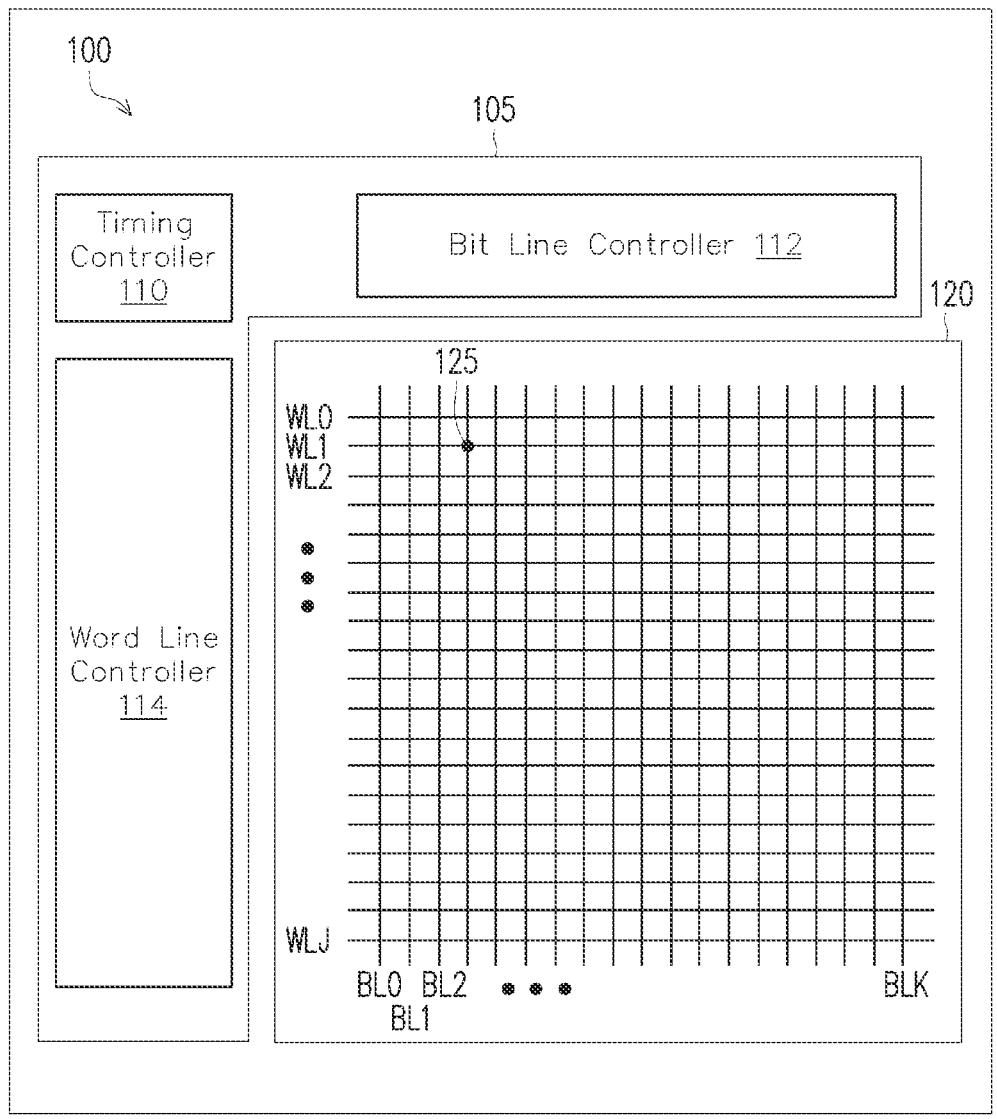
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system can store multi-level data based on one or more series connections, one or more parallel connections, or a combination of them of memory cells. In one aspect, the memory system includes a plurality of memory cells and a memory controller coupled to the plurality of memory cells. The plurality of memory cells may include a first memory cell and a second memory cell coupled to each other in series between a first line and a second line, and a third memory cell and a fourth memory cell coupled to each other in series between the second line and a third line. The memory controller may be configured to electrically decouple the first line and the third line to individually program each of the first memory cell, the second memory cell, the third memory cell, and the fourth memory cell. In some embodiments, the memory controller is configured to electrically couple the first line and the third line to read multi-level data stored by the plurality of memory cells by sensing current through the second line or the electrically coupled first line and third line, according to the individually programmed memory cells.

Advantageously, the memory system can store multi-level data (or multiple bits) in an area efficient manner. In one aspect, each memory cell is programmed according to a binary logic state (e.g., logic '0' or logic '1'). Each memory cell may have a resistance corresponding to the programmed state. A group of memory cells may be arranged to have one or more series connections, one or more parallel connections, or a combination of them. Hence, the group of memory cells can have an effective resistance according to the arrangement of the group of memory cells and programmed logic states of the group of memory cells. The effective resistance of the group of memory cells may represent or be associated with a corresponding state of multi-level data. For example, a value of an effective resistance of the group of memory cells may correspond to one of a plurality of states (e.g., '000', '001', '010', '011', '100', '101', etc.). In one aspect, the number of available effective resistances of the group of memory cells is larger than the number of memory cells in the group. Hence, the number of available states that can be represented by the group of memory cells is larger than the number of memory cells in the group. Accordingly, area efficiency can be achieved to store multi-level data.

Although various embodiments disclosed herein are described with respect to a memory system including resistive memory cells, different memory cells may be implemented in some embodiments. For example, the memory system may include any non-volatile memory cells or any memory cells that can be arranged in one or more series connections, one or more parallel connections, or any combination of them.

FIG. 1 is a diagram of a memory system 100, in accordance with one embodiment. In some embodiments, the memory system 100 includes a memory controller 105 and a memory array 120. The memory array 120 may include a plurality of storage circuits or memory cells 125 arranged in two- or three-dimensional arrays.

Each memory cell 125 may be connected to a corresponding word line WL and a corresponding bit line BL. The memory controller 105 may write data to or read data from the memory array 120 according to electrical signals through word lines WL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of memory cells 125. The memory array 120 includes word lines WL0, WL1 ... WLJ, each extending in a first direction (e.g., X-direction) and bit lines BL0, BL1 ... BLK, each extending in a second direction (e.g., Y-direction). The word lines WL and the bit lines BL may be conductive metals or conductive rails. In one aspect, each memory cell 125 is connected to a corresponding word line WL and a corresponding bit line BL, and can be operated according to voltages or currents through the corresponding word line WL and the corresponding bit line BL. In one aspect, each memory cell 125 may be a ferroelectric field-effect transistor (FeFET), resistive memory cell, or any non-volatile memory cell. In some embodiments, the memory array 120 includes additional lines (e.g., select lines, reference lines, reference control lines, power rails, etc.). The memory array 120 may store weight data or bias data for constructing a neural network. The memory array 120 may improve storage density by storing multi-level data by a group of memory cells 125. Hence, large amount of data for constructing a neural network can be implemented in an efficient manner in terms of hardware resources (or amount of memory cells). Detailed descriptions on configurations and operations of the memory system 100 are provided below with respect to FIGS. 2 through 12.

The memory controller 105 is a hardware component that controls operations of the memory array 120. In some embodiments, the memory controller 105 includes a bit line controller 112, a word line controller 114, and a timing controller 110. In one configuration, the word line controller 114 is a circuit that provides a voltage or a current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be connected to bit lines BL of the memory array 120, and the word line controller 114 may be connected to word lines WL of the memory array 120. In one example, to write data to a memory cell 125, the word line controller 114 provides a voltage or current to the memory cell 125 through a word line WL connected to the memory cell 125, and the bit line controller 112 applies a bias voltage to the memory cell 125 through a bit line BL and/or a select line connected to the memory cell 125. In one example, to read data from a memory cell 125, the word line controller 114 provides a voltage or current to the memory cell 125 through a word line WL connected to the memory cell 125, and the bit line controller 112 senses a voltage or current corresponding to data stored by the memory cell 125 through a bit line and/or a select line connected to the memory cell 125. In some embodiments, the memory controller 105 includes more, fewer, or different components than shown in FIG. 1.

Figure 2:
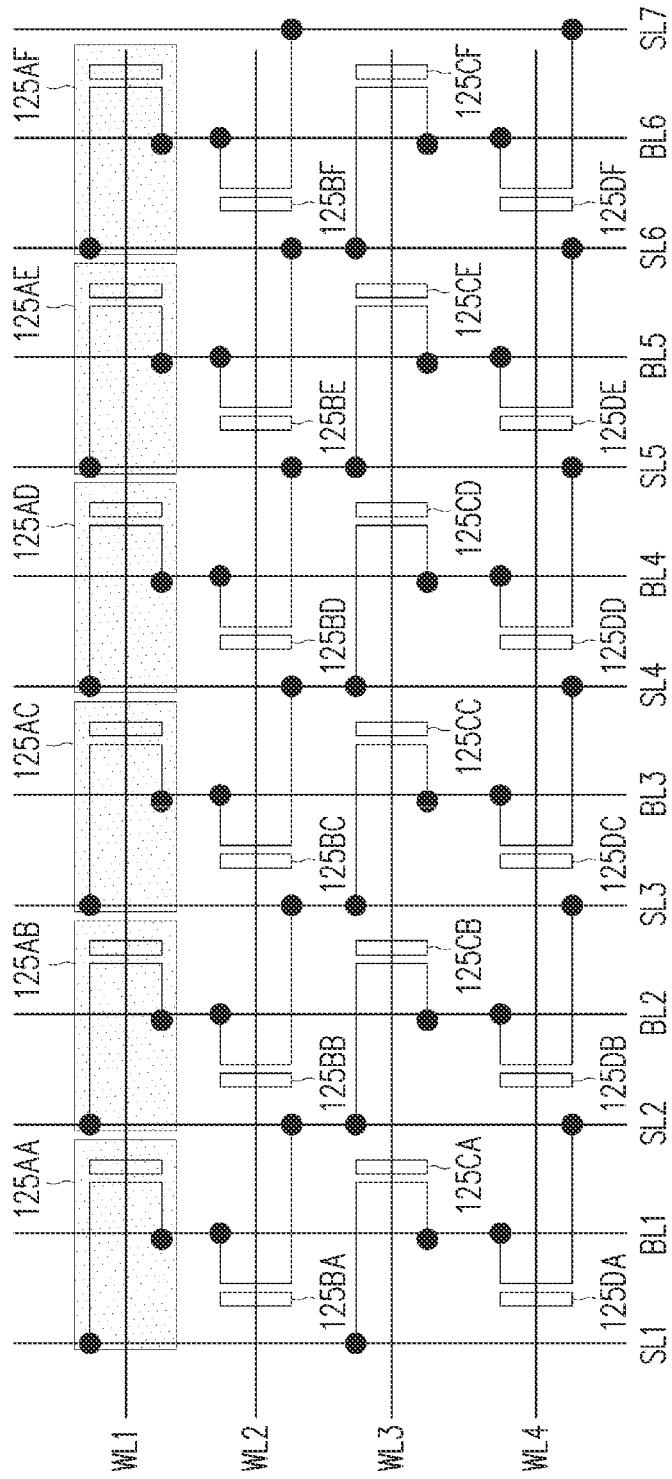
FIG. 2 is a diagram of a plurality of memory cells configured to operate as multi-level cells, in accordance with one embodiment.

FIG. 2 is a diagram of multiple memory cells 125 configured to operate as multi-level cells (MLCs), in accordance with one embodiment. In some embodiments, the memory cells 125 are arranged in a two-dimensional array or a three-dimensional array. Each memory cell 125 may be a FeFET, resistive memory cell, or any non-volatile memory cell. In one example, the memory cells 125 include memory cells 125AA ... 125AF disposed in a first row, memory cells 125BA ... 125BF disposed in a second row, memory cells 125CA ... 125CF disposed in a third row, and memory cells 125DA ... 125DF disposed in a fourth row. In one aspect, the memory cells 125 may be configured in one or more series connections, one or more parallel connections, or a combination of them to store multi-level data. In some embodiments, the memory cells 125 include additional or fewer memory cells. In some embodiments, the memory cells 125 are arranged in a different configuration than shown in FIG. 2.

In one configuration, source electrodes of the memory cells 125AA, 125CA are connected to a select line SL1, and drain electrodes of the memory cells 125AA, 125CA are connected to a bit line BL1. In one configuration, source electrodes of the memory cells 125AB, 125CB are connected to a select line SL2, and drain electrodes of the memory cells 125AB, 125CB are connected to a bit line BL2. In one configuration, source electrodes of the memory cells 125AC, 125CC are connected to a select line SL3, and drain electrodes of the memory cells 125AC, 125CC are connected to a bit line BL3. In one configuration, source electrodes of the memory cells 125AD, 125CD are connected to a select line SL4, and drain electrodes of the memory cells 125AD, 125CD are connected to a bit line BL4. In one configuration, source electrodes of the memory cells 125AE, 125CE are connected to a select line SL5, and drain electrodes of the memory cells 125AE, 125CE are connected to a bit line BL5. In one configuration, source electrodes of the memory cells 125AF, 125CF are connected to a select line SL6, and drain electrodes of the memory cells 125AF, 125CF are connected to a bit line BL6. The select lines SL and bit lines BL may extend along a parallel direction in an interleaving manner.

In one configuration, source electrodes of the memory cells 125BA, 125DA are connected to the select line SL2, and drain electrodes of the memory cells 125BA, 125DA are connected to the bit line BL1. In one configuration, source electrodes of the memory cells 125BB, 125 DB are connected to the select line SL3, and drain electrodes of the memory cells 125BB, 125 DB are connected to the bit line BL2. In one configuration, source electrodes of the memory cells 125BC, 125DC are connected to the select line SL4, and drain electrodes of the memory cells 125BC, 125DC are connected to the bit line BL3. In one configuration, source electrodes of the memory cells 125BD, 125DD are connected to the select line SL5, and drain electrodes of the memory cells 125BD, 125DD are connected to the bit line BL4. In one configuration, source electrodes of the memory cells 125BE, 125DE are connected to the select line SL6, and drain electrodes of the memory cells 125BE, 125DE are connected to the bit line BL5. In one configuration, source electrodes of the memory cells 125BF, 125DF are connected to a select line SL7, and drain electrodes of the memory cells 125BF, 125DF are connected to the bit line BL6.

In one configuration, gate electrodes of the memory cells 125AA, 125AB, 125AC, 125AD, 125AE, 125AF are connected to a word line WL1. In one configuration, gate electrodes of the memory cells 125BA, 125BB, 125BC, 125BD, 125BE, 125BF are connected to a word line WL2. In one configuration, gate electrodes of the memory cells 125CA, 125CB, 125CC, 125CD, 125CE, 125CF are connected to a word line WL3. In one configuration, gate electrodes of the memory cells 125DA, 125DB, 125DC, 125DD, 125DE, 125DF are connected to a word line WL4. The word lines WL1 . . . WL4 may extend along a direction perpendicular the direction of the select lines SL and bit lines BL.

In one aspect, the memory controller 105 may apply voltages or currents through the word lines WL1-WL4, select lines SL1-SL7, or bit lines BL1-BL6 to individually program the memory cells 125. In one aspect, each memory cell 125 is programmed according to a binary state. For example, the memory cell 125AA is programmed to have a first state with a low resistance (e.g., less than 4 kΩ), and the memory cell 125AB is programmed to have a second state with a high resistance (e.g., higher than 40 kΩ). Examples of programming memory cells 125 are provided below with respect to FIGS. 3A, 3B, 4A, and 4B.

In one aspect, the memory controller 105 may apply voltages or currents through the word lines WL1-WL4, select lines SL1-SL7, or bit lines BL1-BL6 to read multi-level data stored by a plurality of memory cells 125. In one approach, the memory controller 105 can configure the plurality of memory cells 125 to have one or more series connections, one or more parallel connections, or a combination of them. For example, the memory controller 105 may electrically float the bit lines BL1, BL2 while electrically coupling the select lines SL1, SL3. By electrically floating the bit lines BL1, BL2 while electrically coupling the select lines SL1, SL3, the memory cells 125AA 125BA can be configured in a first series connection, and the memory cells 125AB, 125BB can be configured in a second series connection. The first series connection and the second series connection may have a parallel connection between the select lines SL1, SL2. By arranging the memory cells 125 to have one or more series connections, one or more parallel connections, or a combination of them, multi-level data stored by the memory cells 125 can be read. In some embodiments, the memory controller 105 may configure three or more memory cells 125 to form a series connection. Examples of reading multi-level data stored by a plurality of memory cells 125 are provided below with respect to FIGS. 5, 6A, 6B, 7, 8 and 12.

Figure 3A:
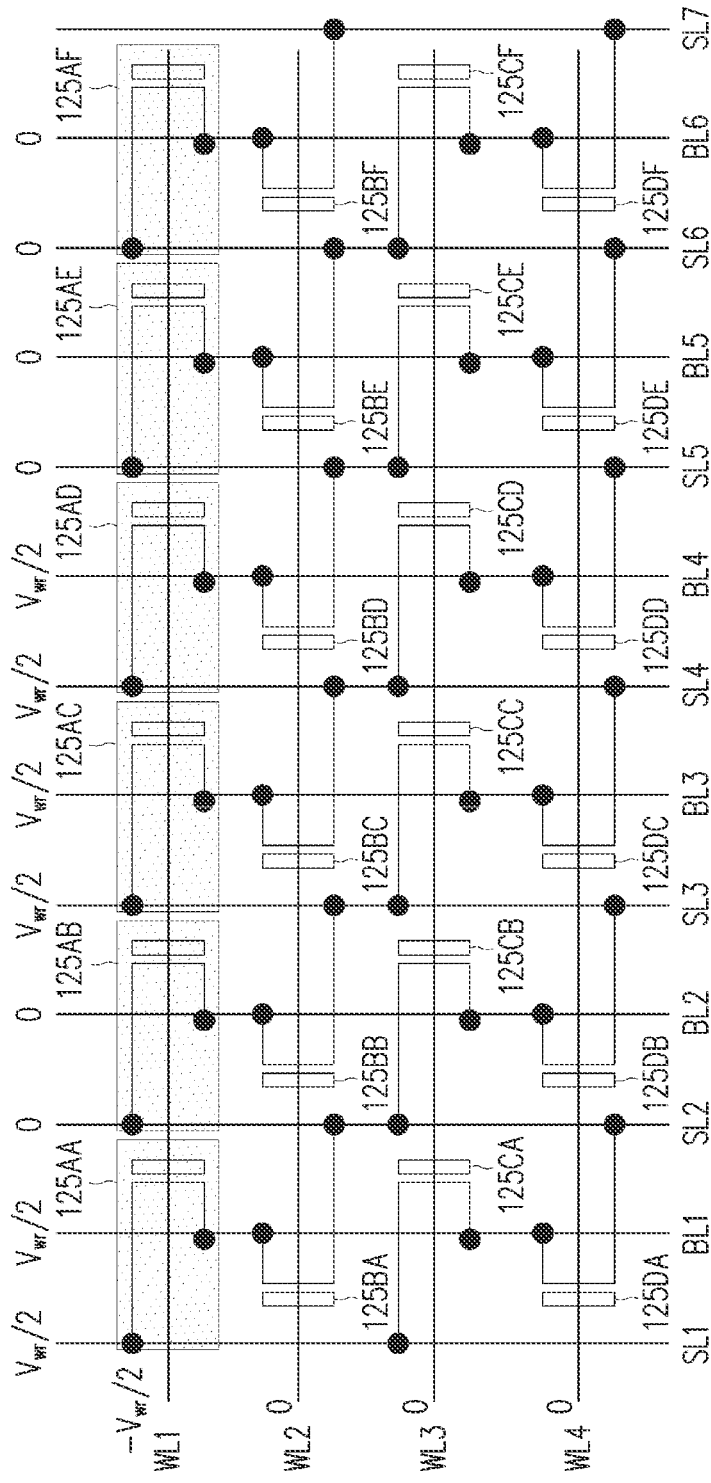
FIG. 3A is a diagram showing voltages applied to individually program memory cells, in accordance with one embodiment.

FIG. 3A is a diagram showing voltages applied to individually program memory cells 125AA, 125AC, 125AD, in accordance with one embodiment. In one approach, the memory controller 105 applies a first write voltage $-Vwr/2$ to the word line WL1, and a second write voltage $Vwr/2$ to the lines SL1, BL1, SL3, BL3, SL4, BL4, such that the voltage difference $-Vwr$ can be applied between i) the gate electrodes and ii) the source/drain electrodes of each of the memory cells 125AA, 125AC, 125AD. By applying the voltage difference $-Vwr$ between i) the gate electrodes and ii) the source/drain electrodes of each of the memory cells 125AA, 125AC, 125AD, each of the memory cells 125AA, 125AC, 125AD may be programmed to have a first state (e.g., logic '0'). The memory controller 105 may apply a ground voltage to the lines SL2, BL2, SL5, BL5, SL6, BL6, such that the voltage difference $-Vwr/2$ can be applied between i) the gate electrodes and ii) the source/drain electrodes of each of the memory cells 125AB, 125AE, 125AF. By applying the voltage difference $-Vwr/2$ less than the voltage $Vwr$ between i) the gate electrodes and ii) the source/drain electrodes of each of the memory cells 125AB, 125AE, 125AF, the memory cells 125AB, 125AE, 125AF may not be programmed. The memory controller 105 may apply a ground voltage to the word lines WL2, WL3, WL4, such that the memory cells 125BA . . . 125BF, 125CA . . . 125CF, 125DA . . . 125DF may not be programmed, despite the voltages applied to the lines SL1 . . . SL7, BL1 . . . BL6. After programming one or more memory cells 125 in a first row, the memory controller 105 may apply the write voltage $-Vwr/2$ to the subsequent word line (e.g., WL2) to program one or more memory cells in the subsequent row. Accordingly, selected memory cells can be programmed.

Figure 3B:
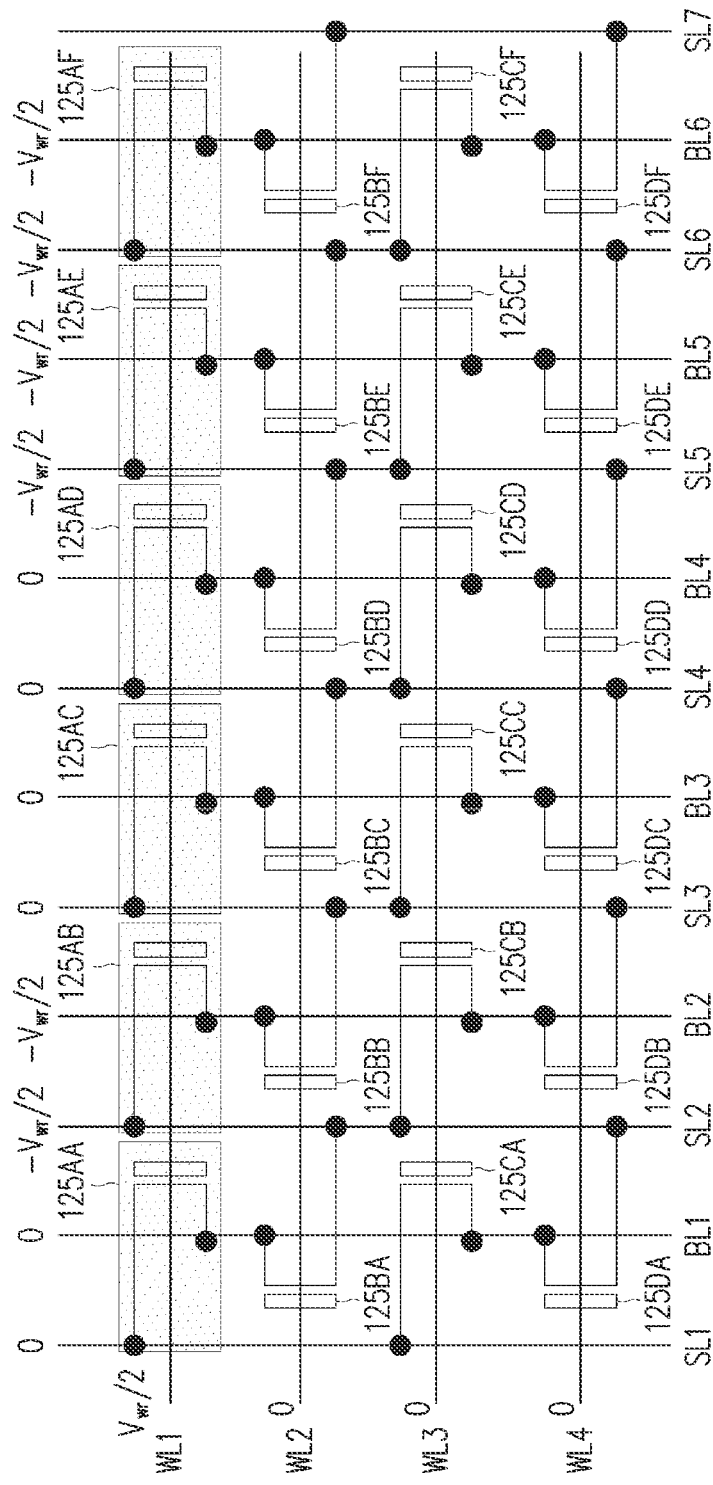
FIG. 3B is a diagram showing voltages applied to individually program memory cells, in accordance with one embodiment.

FIG. 3B is a diagram showing voltages applied to individually program memory cells 125AB, 125AE, 125AF, in accordance with one embodiment. In one approach, the memory controller 105 applies a second write voltage $Vwr/2$ to the word line WL1, and a first write voltage $-Vwr/2$ to the lines SL2, BL2, SL5, BL5, SL6, BL6, such that the voltage difference $Vwr$ can be applied between i) the gate electrodes and ii) the source/drain electrodes of each of the memory cells 125AB, 125AE, 125AF. By applying the voltage difference $Vwr$ between i) the gate electrodes and ii) the source/drain electrodes of each of the memory cells 125AB, 125AE, 125AF, each of the memory cells 125AB, 125AE, 125AF may be programmed to have a second state (e.g., logic '1'). The memory controller 105 may apply a ground voltage to the lines SL1, BL1, SL3, BL3, SL4, BL4, such that the voltage difference $Vwr/2$ can be applied between i) the gate electrodes and ii) the source/drain electrodes of each of the memory cells 125AA, 125AC, 125AD. By applying the voltage difference $Vwr/2$ less than the voltage $Vwr$ between i) the gate electrodes and ii) the source/drain electrodes of each of the memory cells 125AA, 125AC, 125AD, the memory cells 125AA, 125AC, 125AD may not be programmed. The memory controller 105 may apply a ground voltage to the word lines WL2, WL3, WL4, such that the memory cells 125BA . . . 125BF, 125CA . . . 125CF, 125DA . . . 125DF may not be programmed, despite the voltages applied to the lines SL1 . . . SL7, BL1 . . . BL6.

In one aspect, the memory controller 105 may program a first set of memory cells to have a first state during a first time period and program a second set of memory cells to have a second state during a second time period. For example, the memory controller 105 may program the memory cells 125AB, 125AE, 125AF as shown in FIG. 3B before or after programing the memory cells 125AA, 125AC, 125AD as shown in FIG. 3A, such that the memory cells 125AA, 125AB, 125AC, 125AD, 125AE, 125AF may store states [010011]. After programming one or more memory cells 125 in a first row, the memory controller 105 may apply the write voltage Vwr/2 or −Vwr/2 to the subsequent word line (e.g., WL2) to program one or more memory cells in the subsequent row. Accordingly, selected memory cells 125 can be individually programmed to have different states.

Figure 4A:
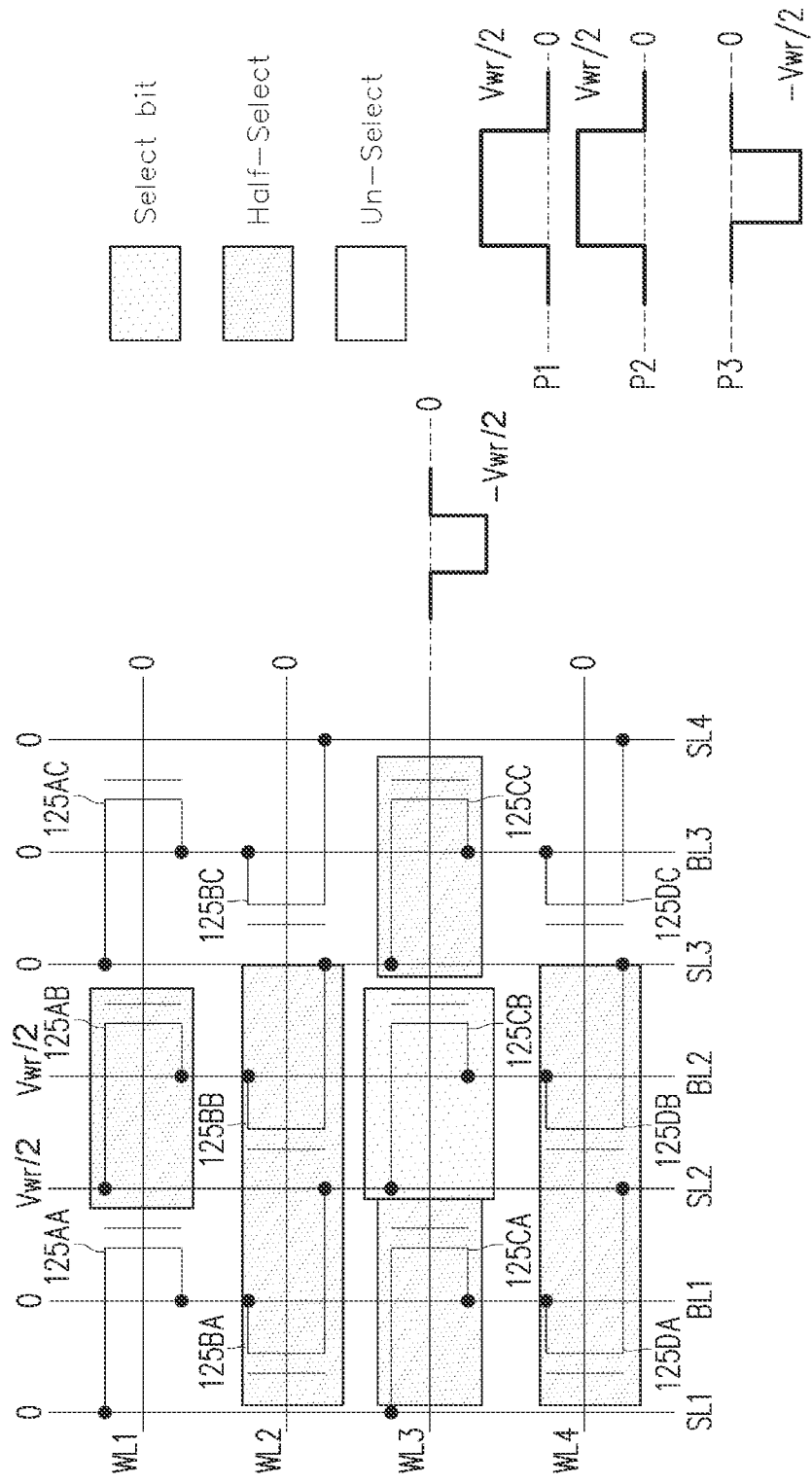
FIG. 4A is a diagram showing voltages applied to write a first logic state at a memory cell, in accordance with one embodiment.

FIG. 4A is a diagram showing voltages applied to write a first logic state (e.g., '0') at the memory cell 125CB, in accordance with one embodiment. In some embodiments, the memory controller 105 applies pulses P1, P2 having amplitudes of the write voltage Vwr/2 to the lines SL2, BL2, respectively, while applying the ground voltage to the lines SL1, BL1, SL3, BL3, SL4. While applying the pulses P1, P2 having the amplitudes of the write voltage Vwr/2 to the lines SL2, BL2, respectively, the memory controller 105 may apply a pulse P3 having an amplitude of −Vwr/2 to the word line WL3. The memory controller 105 may apply the ground voltage to the word lines WL1, WL2, WL4 while applying the pulse P3 to the word line WL3. By applying the pulses P1, P2, P3 to the lines SL2, BL2, WL3, respectfully, as shown in FIG. 4A, a voltage difference −Vwr can be applied between i) the gate electrode and ii) the source/drain electrodes of the memory cell 125CB. By applying the voltage difference −Vwr between i) the gate electrode and ii) the source/drain electrodes of the memory cell 125CB, the memory cell 125CB may have the first state (e.g., logic '0'). The other memory cells 125AA . . . 125AC, 125BA . . . 125BC, 125CA, 125CC, 125DA . . . 125DC may not be programmed, because magnitudes of voltage differences applied between (i) the gate electrodes and ii) the source/drain electrodes are less than Vwr. Accordingly, a selected memory cell 125CB can be individually programmed.

Figure 4B:
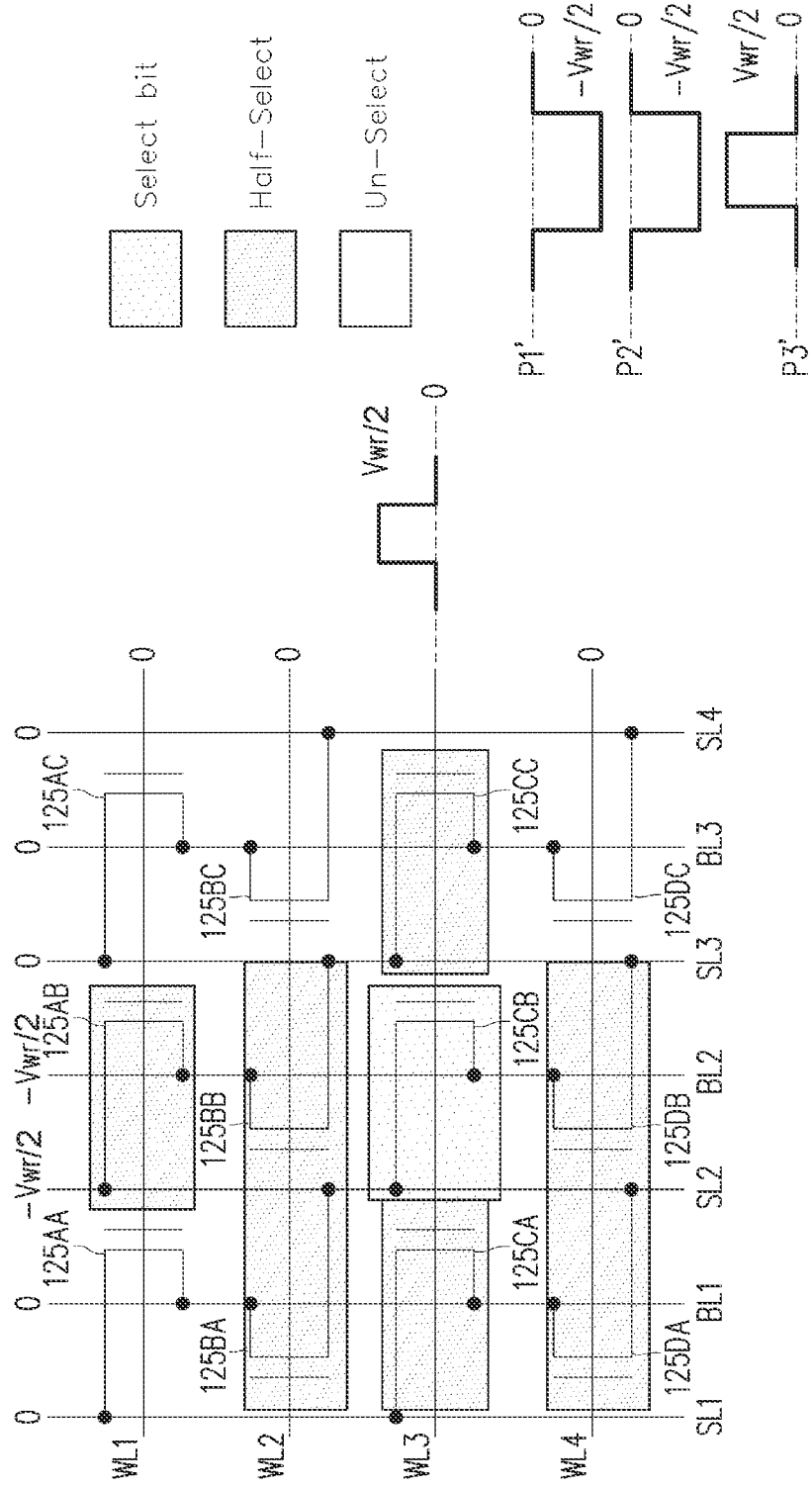
FIG. 4B is a diagram showing voltages applied to write a second logic state at a memory cell, in accordance with one embodiment.

FIG. 4B is a diagram showing voltages applied to write a second logic state (e.g., '1') at the memory cell 125CB, in accordance with one embodiment. In some embodiments, the memory controller 105 applies pulses P1', P2' having amplitudes of the write voltage −Vwr/2 to the lines SL2, BL2, while applying the ground voltage to the lines SL1, BL1, SL3, BL3, SL4. While applying the pulses P1', P2' having the amplitudes of the write voltage −Vwr/2 to the lines SL2, BL2, the memory controller 105 may apply a pulse P3' having an amplitude of Vwr/2 to the word line WL3. The memory controller 105 may apply the ground voltage to the word lines WL1, WL2, WL4 while applying the pulse P3' to the word line WL3. By applying the pulses P1', P2', P3' to the lines SL2, BL2, WL3, respectfully, as shown in FIG. 4B, a voltage difference Vwr can be applied between i) the gate electrode and ii) the source/drain electrodes of the memory cell 125CB. By applying the voltage difference Vwr between i) the gate electrode and ii) the source/drain electrodes of the memory cell 125CB, the memory cell 125CB may have the second state (e.g., logic '1'). The other memory cells 125AA . . . 125AC, 125BA . . . 125BC, 125CA, 125CC, 125DA . . . 125DC may not be programmed, because magnitudes of voltage differences applied between (i) the gate electrodes and ii) the source/drain electrodes are less than Vwr. Accordingly, a selected memory cell 125CB can be individually programmed.

Figure 5:
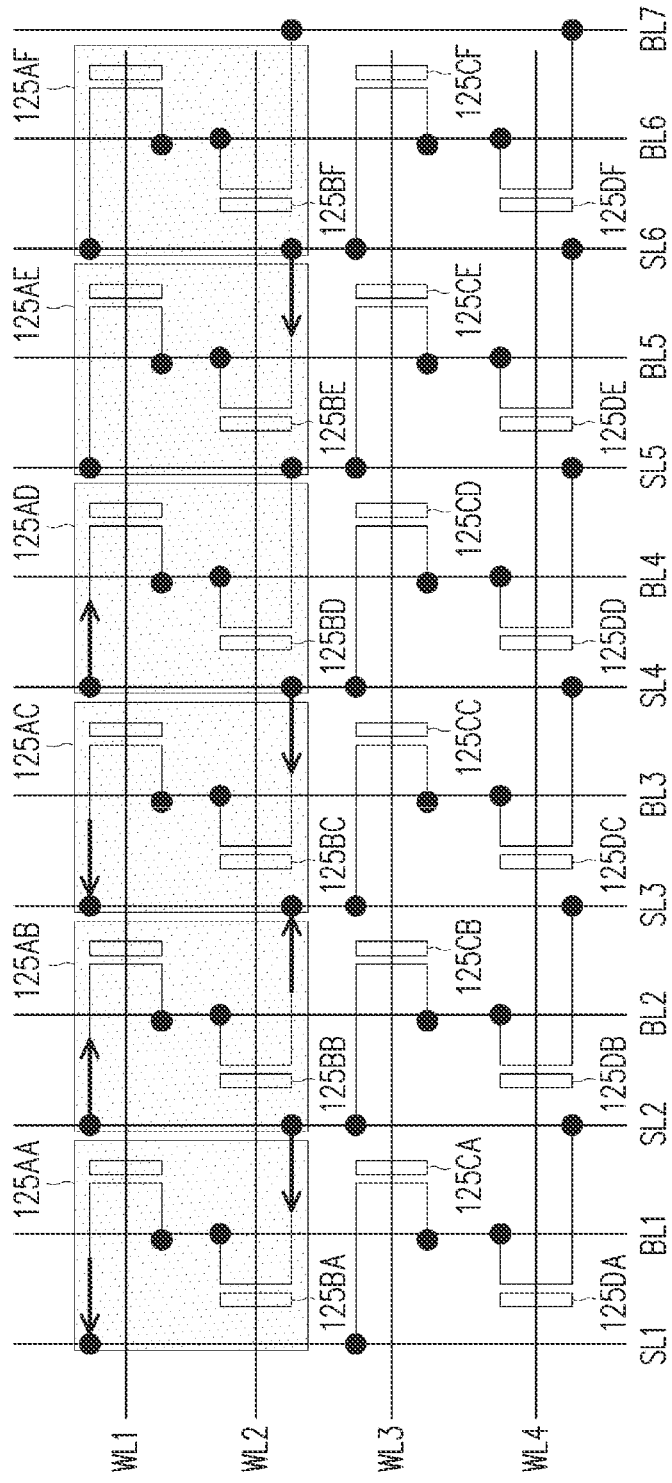
FIG. 5 is a diagram showing a configuration to read multi-level data stored by the plurality of memory cells of FIG. 2, in accordance with one embodiment.

FIG. 5 is a diagram showing a configuration to read multi-level data stored by the plurality of memory cells 125 of FIG. 2, in accordance with one embodiment. In some embodiments, the memory controller 105 may electrically float bit lines BL1, BL2, BL3, BL4, BL5, BL6, such that the memory cells 125 can be arranged to have series connections. For example, memory cells 125AA, 125BA may have a series connection between the lines SL1, SL2; memory cells 125AB, 125BB may have a series connection between the lines SL2, SL3; memory cells 125AC, 125BC may have a series connection between the lines SL3, SL4; memory cells 125AD, 125BD may have a series connection between the lines SL4, SL5; memory cells 125AE, 125BE may have a series connection between the lines SL5, SL6; and memory cells 125AF, 125BF may have a series connection between the lines SL6, SL7. In one approach, the memory controller 105 may apply write pulses to different word lines during different time periods, such that memory cells 125 in different rows coupled to different word lines can be individually programmed. After programming the memory cells 125, the memory controller 105 may simultaneously apply read pulses to two or more adjacent word lines (e.g., WL1, WL2) while electrically floating bit lines BL during a time period, such that current may flow through two or more memory cells 125 arranged in a series connection. In response to the read pulses, current may flow through the two or more memory cells 125 arranged in a series connection, according to the programmed states of the memory cells 125.

In one aspect, two or more memory cells 125 arranged in a series connection may have an effective resistance according to programmed states of the two or more memory cells 125. The memory controller 105 may sense a current corresponding to the effective resistance to determine multi-level data stored by the memory cells 125. For example, the memory controller 105 may sense a current through the select lines SL1, SL2, according to the programmed states of the memory cells 125AA, 125BA. For another example, the memory controller 105 may sense a current through the select lines SL2, SL3, according to the programmed states of the memory cells 125AB, 125BB.

In one aspect, the number of available effective resistances of the group of memory cells 125 is larger than the number of memory cells 125 of the group of memory cells 125. In one aspect, the number of available effective resistances or the number of representable combinations is $C(X,Y)$, where $C(X/Y+Y,Y)=(((X/Y)+Y)!)/(Y! (X/Y)!)$, where X is the total number of memory cells 125 in a group arranged in a combination of parallel connection and serial connection, and Y is a number of memory cells 125 arranged in a series connection. For example, if the total number of memory cells 125 in a group is 4 (X=4) where each series connection has two memory cells 125 (e.g., Y=2), then the number of representable combination C(4,2) is 6. For example, if the total number of memory cells 125 in a group is 8 (e.g., X=8) where each series connection has two memory cells 125 (e.g., Y=2), then the number of representable combination C(6,2) is 15. For example, if the total number of memory cells 125 in a group is 6 (e.g., X=6) where each series connection has three memory cells 125 (e.g., Y=3), then the number of representable combination C(5,2) is 10. For example given, if the total number of memory cells 125 in a group is 9 (e.g., X=9) where each series connection has two memory cells 125 (e.g., Y=3), then the number of representable combination C(6,2) is 20. Hence, the number of available effective resistances or the number of available states that can be represented by the group of memory cells 125 is larger than the number of memory cells 125 in the group. Accordingly, area efficiency can be achieved to store multi-level data.

Figure 6A:
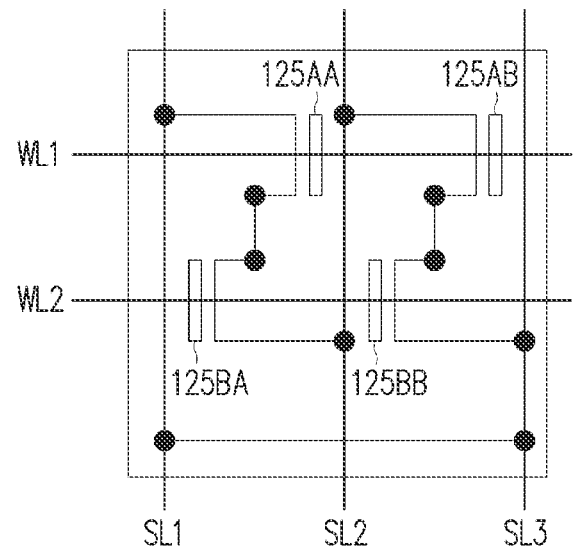
FIG. 6A is a diagram showing an example configuration to read multi-level data stored by a group of memory cells, in accordance with one embodiment.
Figure 6B:
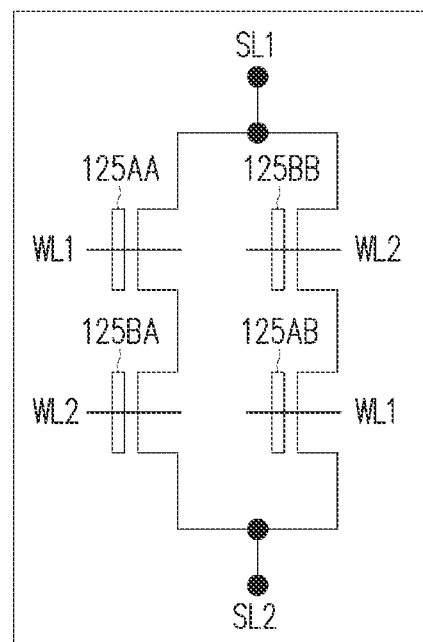
FIG. 6B is an equivalent circuit diagram of the group of memory cells shown in FIG. 6A, in accordance with one embodiment.

FIG. 6A is a diagram showing an example configuration to read multi-level data stored by a group of memory cells 125 including memory cells 125AA, 125AB, 125BA, 125BB, in accordance with one embodiment. FIG. 6B is an equivalent circuit diagram of the group of memory cells 125 shown in FIG. 6A, in accordance with one embodiment. In one approach, the memory controller 105 can electrically float bit lines BL1, BL2 and electrically couple the select lines SL1, SL3. For example, the memory controller 105 may enable a transistor or a switch between the select lines SL1, SL3 to electrically couple the selects lines SL1, SL3. By electrically floating the bit lines BL1, BL2, and electrically coupling the select lines SL1, SL3, the memory cells 125AA, 125BA can be arranged to have a first series connection between the select lines SL1, SL2, and the memory cells 125AB, 125BB can be arranged to have a second series connection between the select lines SL2, SL1 (or SL3). The first series connection and the second series connection may have a parallel connection between the select lines SL1, SL2, as shown in FIGS. 6A and 6B.

Figure 7:
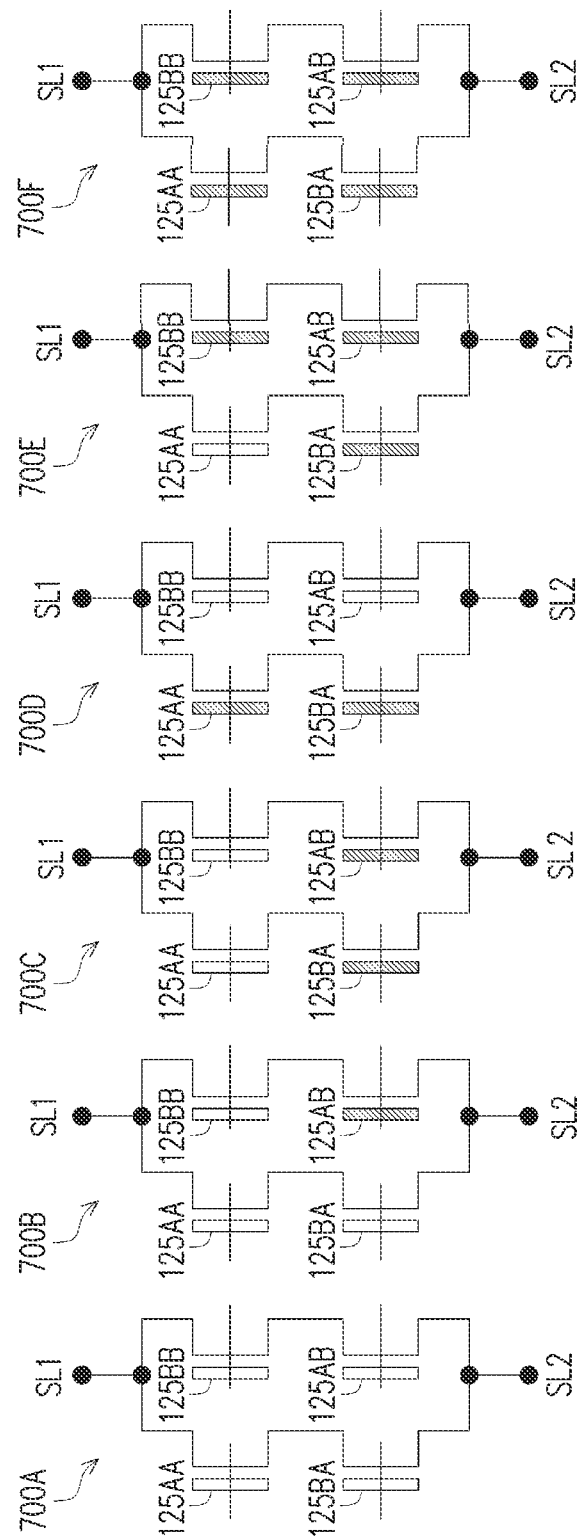
FIG. 7 shows different programmed states of a group of memory cells to represent multi-level data, in accordance with one embodiment.

FIG. 7 shows different programmed states of a group of memory cells 125 to represent multi-level data, in accordance with one embodiment. The memory cells 125 can be programmed to have one of six representable combinations 700A . . . 700F as shown in FIG. 7. In a first combination 700A, each of four memory cells 125AA, 125BA, 125AB, 125BB is programmed to have a first state '0'. In a second combination 700B, each of memory cells 125AA, 125BA, 125BB is programmed to have a first state '0', where the memory cell 125AB is programmed to have a second state '1'. In a third combination 700C, each of memory cells 125AA, 125BB is programmed to have a first state '0', where each of memory cells 125BA, 125AB is programmed to have a second state '1'. In a fourth combination 700D, each of memory cells 125AA, 125BA is programmed to have a second state '1', where each of memory cells 125BB, 125AB is programmed to have a first state '0'. In a fifth combination 700E, the memory cells 125AA is programmed to have a first state '0', where each of the memory cells 125BA, 125BB, 125AB is programmed to have a second state '1'. In a sixth combination 700F, each of the memory cells 125AA, 125BA, 125BB, 125AB is programmed to have a second state '1'. The memory controller 105 may program the memory cells 125AA, 125AB, 125BA, 125BB to any one of the combinations 700A-700F to store a corresponding multi-level data.

Figure 8:
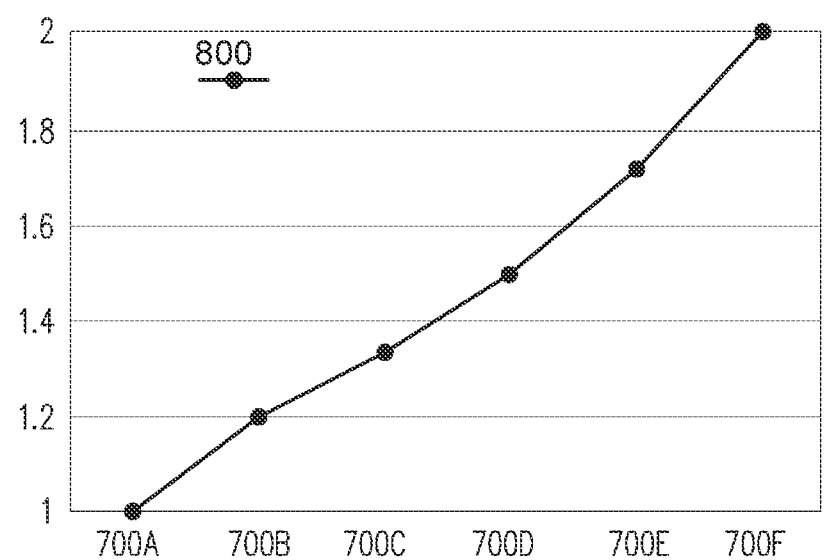
FIG. 8 shows a change in a resistance of a group of memory cells according to varying programmed states, in accordance with one embodiment.

FIG. 8 shows a plot 800 indicating a change in an effective resistance of a group of memory cells 125AA, 125AB, 125BA, 125BB according to varying programmed states, in accordance with one embodiment. In one example, the effective resistance of the group of memory cells 125AA . . . 125BB arranged in the combinations 700A . . . 700F may linearly or non-linearly increase. The memory controller 105 may sense current corresponding to the effective resistance of the group of memory cells 125 though the select line SL2 or the electrically coupled select lines SL1, SL3. According to the sensed current, the memory controller 105 may determine a multi-level data stored by the group of memory cells 125. Advantageously, multi-level data can be determined based on a single measurement of current through the group of memory cells 125, instead of employing multiple sensors or individually sensing current through each memory cell 125. Accordingly, the memory system 100 can achieve area efficiency.

Figure 9:
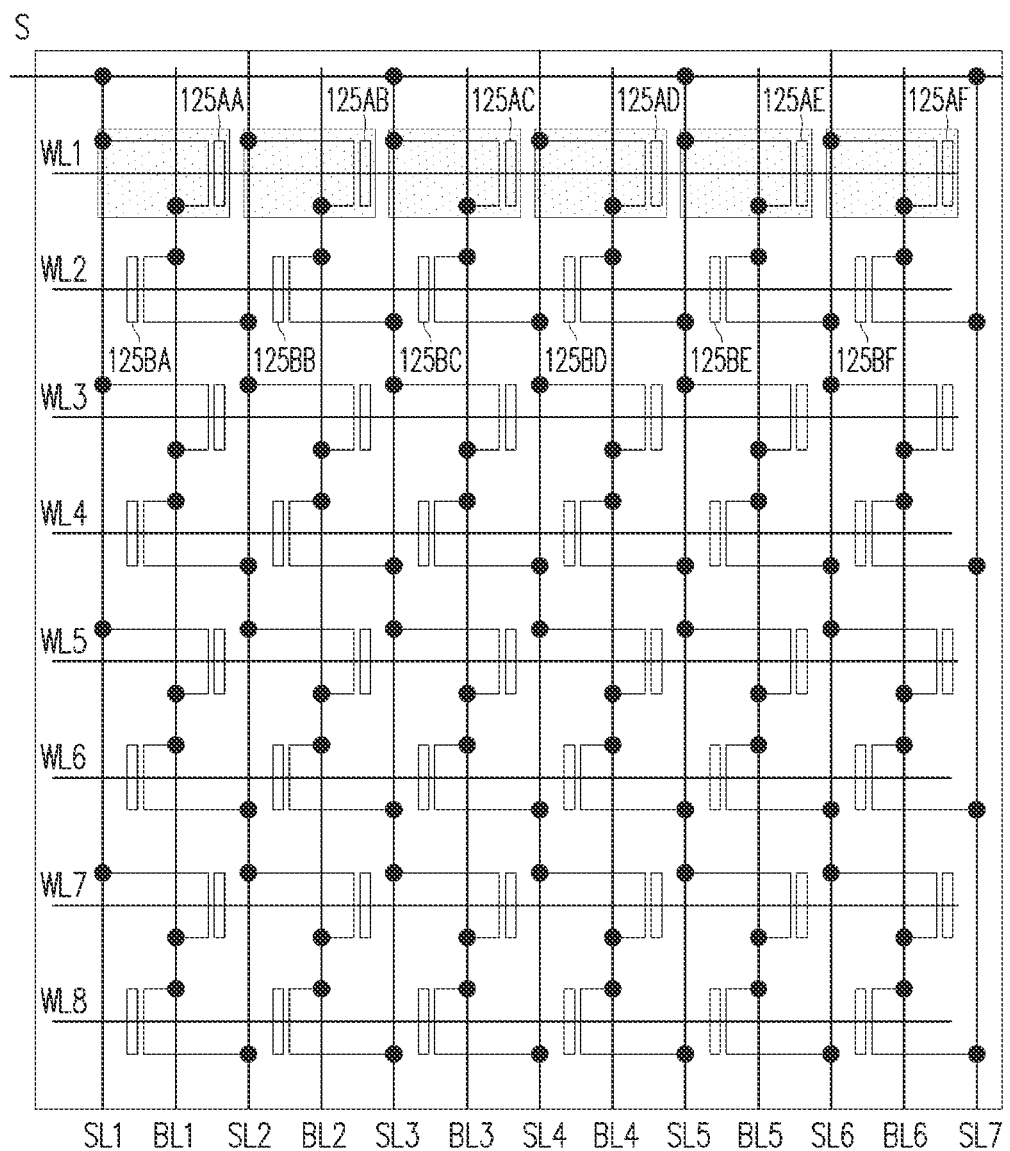
FIG. 9 shows a group of memory cells to store multi-level data, in accordance with one embodiment.

FIG. 9 shows a plurality of memory cells 125 configured to operate as multi-level cells, in accordance with one embodiment. In one configuration, the memory controller 105 may electrically couple the select lines SL1, SL3, SL5, SL7, while electrically floating the bit lines BL1-BL6. The memory controller 105 may also electrically couple the select lines SL2, SL4, SL6. By electrically coupling the select lines SL1, SL3, SL5, SL7 while electrically floating the bit lines BL1-BL6 and electrically coupling the select lines SL2, SL4, SL6, the memory cells 125AA-125AF, 125BA-125BF can be arranged to have parallel connections of multiple pairs of memory cells connected in series. For example, the memory cells 125AA-125AF, 125BA-125BF can be arranged to have six pairs of memory cells 125 connected in series. In approach, the memory controller 105 may electrically couple the word lines WL1, WL3, and electrically couple the word lines WL2, WL4, such that additional pairs of memory cells can be added and contribute to an effective resistance of the group of memory cells.

Figure 10:
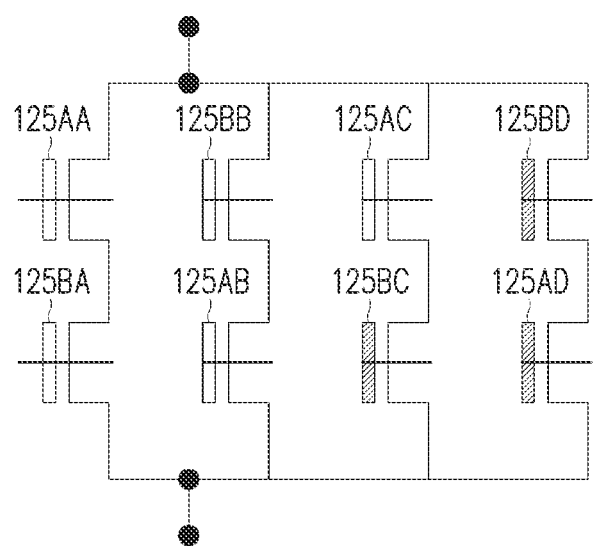
FIG. 10 shows a plurality of memory cells configured to operate as multi-level cells, in accordance with one embodiment.

FIG. 10 shows an equivalent circuit diagram of a group of memory cells 125 to store multi-level data, in accordance with one embodiment. In some embodiments, eight memory cells 125AA-125AD, 125BA-125BD can be arranged to have a parallel connection of four pairs of memory cells connected in series. In one approach, the memory controller 105 may electrically couple the select lines SL2, SL4 and electrically couple the select lines SL1, SL3, SL5, while electrically floating the bit lines BL1, BL2, BL3, BL4. By configuring the memory cells 125 to have parallel connections of additional memory cells 125 connected in series, the number of available effective resistances can be increased.

Figure 11:
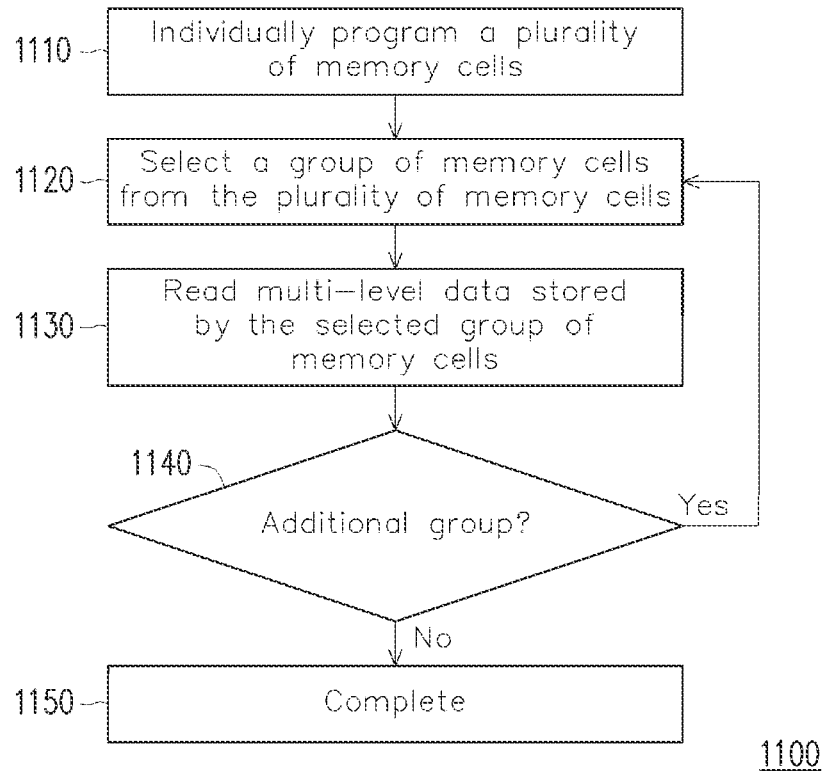
FIG. 11 is a flowchart of a method of operating a plurality of memory cells, in accordance with some embodiments.

FIG. 11 is a flowchart of a method 1100 of operating a plurality of memory cells 125, in accordance with some embodiments. The method 1100 may be performed by the memory controller 105 of FIG. 1. In some embodiments, the method 1100 is performed by other entities. In some embodiments, the method 1100 includes more, fewer, or different operations than shown in FIG. 11.

In an operation 1110, the memory controller 105 individually programs a plurality of memory cells 125. The memory controller 105 may program one or more memory cells 125 as described above with respect to FIG. 3A, 3B, 4A, or 4B. In one approach, the memory controller 105 applies a first write voltage −Vwr/2 to a word line WL connected to a memory cell 125 and applies a second write voltage Vwr/2 to lines SL, BL connected to the memory cell 125, such that the voltage difference −Vwr can be applied between i) the gate electrode and ii) the source/drain electrodes of the memory cell 125. By applying the voltage difference −Vwr between i) the gate electrode and ii) the source/drain electrodes of the memory cell 125, the memory cell 125 may be programmed to have a first state (e.g., logic '0'). In one approach, the memory controller 105 applies the second write voltage Vwr/2 to the word line WL connected to the memory cell 125 and applies the first write voltage −Vwr/2 to the lines SL, BL connected to the memory cell 125, such that the voltage difference Vwr can be applied between i) the gate electrode and ii) the source/drain electrodes of the memory cell 125. By applying the voltage difference Vwr between i) the gate electrode and ii) the source/drain electrodes of the memory cell 125, the memory cell 125 may be programmed to have a second state (e.g., logic '1').

In an operation 1120, the memory controller 105 selects a group of memory cells 125 from the plurality of memory cells 125. In one aspect, the group of memory cells 125 may be configured to collectively store multi-level data, according to individually programmed states of the group of memory cells 125.

In an operation 1130, the memory controller 105 reads multi-level data stored by the selected group of memory cells 125. The memory controller 105 may read multi-level data as described above with respect to FIGS. 5-7. In one approach, the memory controller 105 may arrange or configure the group of memory cells 125 to have a series connection, parallel connection, or a combination of them. The memory controller 105 may sense a current through the group of memory cells 125, according to an equivalent resistance of the group of memory cells 125.

In an operation 1140, the memory controller 105 determines whether an additional group of memory cells exists or not. In response to determining that an additional group of memory cells to read multi-level data exists, the memory controller 105 may proceed to the operation 1120 and select a subsequent group of memory cells 125 from the plurality of memory cells 125 to determine additional multi-level data stored by the subsequent group of memory cells 125. In response to determining that no additional group of memory cells to read multi-level data exists, the memory controller 105 may complete the method 1100 in the operation 1150.

Advantageously, multi-level data (or multiple bits) can be stored and read in an efficient manner. In one aspect, each memory cell 125 is programmed according to a binary logic state (e.g., logic '0' or logic '1'). Each memory cell 125 may have a resistance corresponding to the programmed value. A group of memory cells 125 may be arranged to have one or more series connections, one or more parallel connections, or a combination of them. Hence, the group of memory cells 125 can have an effective resistance according to the arrangement of the group of memory cells 125 and programmed logic states of the group of memory cells 125. The effective resistance of the group of memory cells 125 may represent or be associated with a corresponding state of multi-level data. In one aspect, the number of available effective resistances of the group of memory cells 125 is larger than the number of memory cells 125 in the group. Hence, the number of bits of the multi-level data represented by the group of memory cells 125 is larger than the number of memory cells 125 in the group. Accordingly, multi-level data stored by a group of memory cells 125 can be read based on a single measurement of current through the group of memory cells 125.

Figure 12:
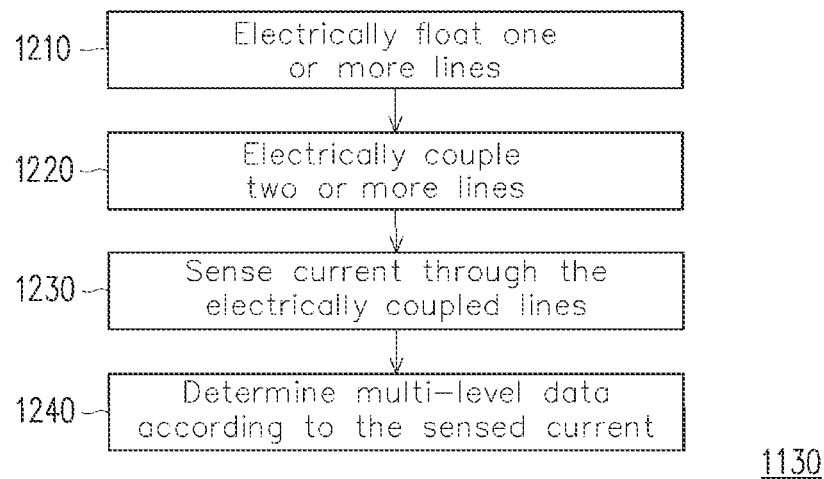
FIG. 12 is a flowchart of a method of reading multi-level data stored by a group of memory cells, in accordance with some embodiments.

FIG. 12 is a flowchart of the operation 1130 of reading multi-level data stored by a group of memory cells, in accordance with some embodiments. The method 1200 may be performed by the memory controller 105 of FIG. 1. In some embodiments, the method 1200 is performed by other entities. In some embodiments, the method 1200 includes more, fewer, or different operations than shown in FIG. 12.

In an operation 1210, the memory controller 105 electrically floats one or more lines connected to a group of memory cells 125. The group of memory cells 125 may be the selected group of memory cells 125 from the operation 1120. For example, the memory controller 105 electrically floats the bit line BL1 connected to the memory cells 125AA, 125BA, and electrically floats the bit line BL2 connected to the memory cells 125AB, 125BB. By electrically floating the bit lines BL1, BL2, a pair of memory cells 125 can be serially connected between two sense lines. For example, the memory cells 125AA, 125BA can be connected between the select lines SL1, SL2. For example, the memory cells 125AB, 125BB can be connected between the select lines SL2, SL3.

In an operation 1220, the memory controller 105 electrically couples two or more lines connected to the group of memory cells 125, while electrically floating the one or more lines. For example, the memory controller 105 electrically couples the select lines SL1, SL3 to read multi-level stored by the memory cells. By electrically coupling the select lines SL1, SL3, a parallel connection of two branches between the select lines SL1, SL3 can be formed. For example, a first branch may include memory cells 125AA, 125BA connected to each other in series between the select lines SL1, SL2. For example, a second branch may include memory cells 125AB, 125BB connected to each other in series between the select lines SL2, SL3. In one aspect, the group of memory cells 125 can have an effective resistance according to the parallel connection of pairs of memory cells 125 connected in series and programmed states of the memory cells 125.

In an operation 1230, the memory controller 105 senses current through the group of memory cells 125. In one approach, the memory controller 105 simultaneously applies read pulses to two or more adjacent word lines to enable current to flow through the set of memory cells 125 connected in series. In response to the read pulses, current may flow through the set of memory cells 125, according to the programmed states of the two or more memory cells 125. For example, the memory controller 105 may apply a voltage at the select line SL2, and sense current through the electrically coupled lines SL1, SL3. For another example, the memory controller 105 may apply a voltage at the electrically coupled lines SL1, SL3, and sense current through the select line SL2. The current through the set of memory cells 125 may correspond to the effective resistance of the set of memory cells 125.

In an operation 1240, the memory controller 105 determines multi-level data stored by the group of memory cells 125 according to the sensed current. In one approach, the memory controller 105 compares the sensed current with different threshold voltages. For example, in response to the sensed current being within a first range, the memory controller 105 may determine that the group of memory cells 125 stores a first level of multi-level data (e.g., [0001]). For example, in response to the sensed current being within a second range, the memory controller 105 may determine that the group of memory cells 125 stores a second level of multi-level data (e.g., [0010]).

Beneficially, the memory controller 105 can achieve various advantages. In one aspect, the memory system 100 can achieve area efficiency, because the number of bits representable by the group of memory cells 125 is higher than the number of memory cells in the group. In one aspect, the memory system 100 can read multi-level data in a prompt manner based on a single measurement of current through the group of memory cells 152. For example, the memory controller 105 may configure arrangements or connections of the group of memory cells and determine multi-level data stored by the group of memory cells 125 based on the single measurement of current through the group of memory cells 125 in the configured arrangements or connections.

Figure 13:
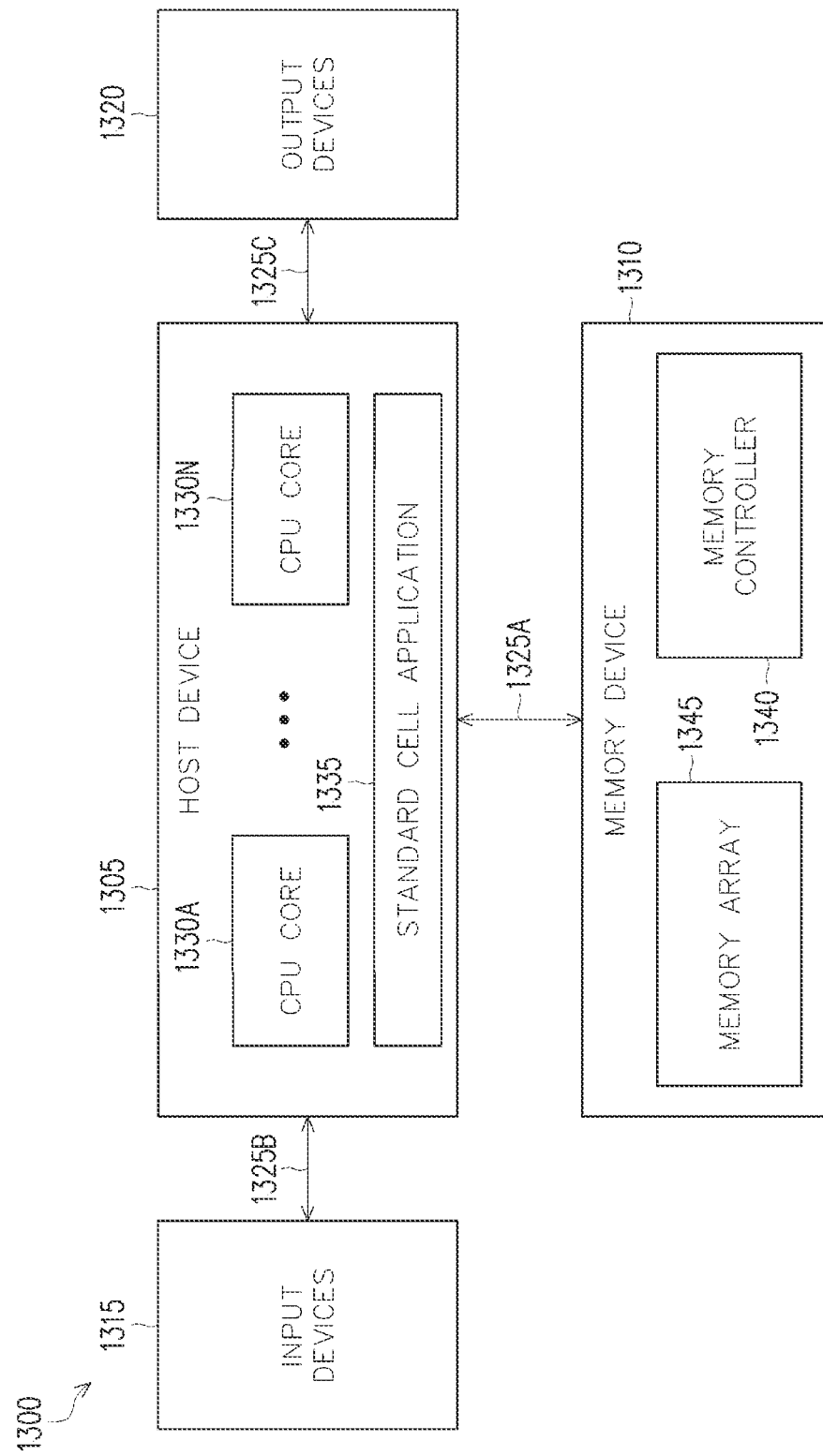
FIG. 13 is an example block diagram of a computing system, in accordance with some embodiments.

Referring now to FIG. 13, an example block diagram of a computing system 1300 is shown, in accordance with some embodiments of the disclosure. The computing system 1300 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1300 includes a host device 1305 associated with a memory device 1310. The host device 1305 may be configured to receive input from one or more input devices 1315 and provide output to one or more output devices 1320. The host device 1305 may be configured to communicate with the memory device 1310, the input devices 1315, and the output devices 1320 via appropriate interfaces 1325A, 1325B, and 1325C, respectively. The computing system 1300 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1305.

The input devices 1315 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1305 and that allows an external source, such as a user (e.g., a circuit or layout designer), to enter information (e.g., data) into the host device and send instructions to the host device. Similarly, the output devices 1320 may include a variety of output technologies such as external memories, printers, speakers, displays, microphones, light emitting diodes, headphones, video devices, and any other output peripherals that are configured to receive information (e.g., data) from the host device 1305. The "data" that is either input into the host device 1305 and/or output from the host device may include any of a variety of textual data, circuit data, signal data, semiconductor device data, graphical data, combinations thereof, or other types of analog and/or digital data that is suitable for processing using the computing system 1300.

The host device 1305 includes or is associated with one or more processing units/processors, such as Central Processing Unit ("CPU") cores 1330A-1330N. The CPU cores 1330A-1330N may be implemented as an Application Specific Integrated Circuit ("ASIC"), Field Programmable Gate Array ("FPGA"), or any other type of processing unit. Each of the CPU cores 1330A-1330N may be configured to execute instructions for running one or more applications of the host device 1305. In some embodiments, the instructions and data to run the one or more applications may be stored within the memory device 1310. The host device 1305 may also be configured to store the results of running the one or more applications within the memory device 1310. Thus, the host device 1305 may be configured to request the memory device 1310 to perform a variety of operations. For example, the host device 1305 may request the memory device 1310 to read data, write data, update or delete data, and/or perform management or other operations. One such application that the host device 1305 may be configured to run may be a standard cell application 1335. The standard cell application 1335 may be part of a computer aided design or electronic design automation software suite that may be used by a user of the host device 1305 to use, create, or modify a standard cell of a circuit. In some embodiments, the instructions to execute or run the standard cell application 1335 may be stored within the memory device 1310. The standard cell application 1335 may be executed by one or more of the CPU cores 1330A-1330N using the instructions associated with the standard cell application from the memory device 1310. In one example, the standard cell application 1335 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 13, the memory device 1310 includes a memory controller 1340 that is configured to read data from or write data to a memory array 1345. The memory array 1345 may include a variety of volatile and/or non-volatile memories. For example, in some embodiments, the memory array 1345 may include NAND flash memory cores. In other embodiments, the memory array 1345 may include NOR flash memory cores, SRAM cores, Dynamic Random Access Memory (DRAM) cores, Magneto resistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1345 may be individually and independently controlled by the memory controller 1340. In other words, the memory controller 1340 may be configured to communicate with each memory within the memory array 1345 individually and independently. By communicating with the memory array 1345, the memory controller 1340 may be configured to read data from or write data to the memory array in response to instructions received from the host device 1305. Although shown as being part of the memory device 1310, in some embodiments, the memory controller 1340 may be part of the host device 1305 or part of another component of the computing system 1300 and associated with the memory device. The memory controller 1340 may be implemented as a logic circuit in either software, hardware, firmware, or combination thereof to perform the functions described herein. For example, in some embodiments, the memory controller 1340 may be configured to retrieve the instructions associated with the standard cell application 1335 stored in the memory array 1345 of the memory device 1310 upon receiving a request from the host device 1305.

It is to be understood that only some components of the computing system 1300 are shown and described in FIG. 13. However, the computing system 1300 may include other components such as various batteries and power sources, networking interfaces, routers, switches, external memory systems, controllers, etc. Generally speaking, the computing system 1300 may include any of a variety of hardware, software, and/or firmware components that are needed or considered desirable in performing the functions described herein. Similarly, the host device 1305, the input devices 1315, the output devices 1320, and the memory device 1310 including the memory controller 1340 and the memory array 1345 may include other hardware, software, and/or firmware components that are considered necessary or desirable in performing the functions described herein.

One aspect of this description relates to a memory system. In some embodiments, the memory system includes a group of memory cells and a memory controller coupled to the group of memory cells. In some embodiments, the group of memory cells includes a first memory cell and a second memory cell coupled to each other in series between a first line and a second line, and a third memory cell and a fourth memory cell coupled to each other in series between the second line and a third line. In some embodiments, the memory controller is configured to electrically decouple the first line and the third line to individually program the group of memory cells. In some embodiments, the memory controller is configured to electrically couple the first line and the third line to read multi-level data stored by the group of memory cells by sensing current through the second line according to the individually programmed memory cells.

One aspect of this description relates to a method of operating a memory system. In some embodiments, the method includes individually setting resistances of a first memory cell, a second memory cell, a third memory cell, and a fourth memory cell. In some embodiments, the first memory cell and the second memory cell are coupled to each other in series between a first line and a second line, and the third memory cell and the fourth memory cell are coupled to each other in series between the second line and a third line. In some embodiments, the method includes sensing current through the second line according to a parallel resistance of i) a first series resistance of the first memory cell and the second memory cell, and ii) a second series resistance of the third memory cell and the fourth memory cell. In some embodiments, the method includes determining or reading multi-level data stored by the first memory cell, the second memory cell, the third memory cell, and the fourth memory cell, according to the sensed current.

One aspect of this description relates to a memory system. In some embodiments, the memory system includes a group of memory cells and a memory controller coupled to the group of memory cells. In some embodiments, the plurality of memory cells includes a first memory cell and a second memory cell coupled to each other in series between a first line and a second line, and a third memory cell and a fourth memory cell coupled to each other in series between the second line and a third line. In some embodiments, the first memory cell and the third memory cell are coupled to a first word line, and the second memory cell and the fourth memory cell are coupled to a second word line. In some embodiments, the memory controller is configured to apply a first pulse to the first word line during a first time to program the first memory cell and the third memory cell, and apply a second pulse to the second word line during a second time to program the third memory cell and the fourth memory cell. In some embodiments, the memory controller is configured to apply a third pulse to the first word line and the second word line during a third time period to sense current through the second line, according to the programmed memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system comprising:
a first memory cell and a second memory cell coupled to each other between a first select line and a second select line; and
a third memory cell and a fourth memory cell coupled to each other between the second select line and a third select line;
wherein the first to third select lines are in parallel with one another;
wherein the first memory cell and the third memory cell are gated by a first word line, and the second memory cell and the fourth memory cell are gated by a second word line; and
wherein each of the first to fourth memory cells includes a ferroelectric field-effect transistor (FeFET).

2. The memory system of claim 1, further comprising:
a memory controller configured to individually set resistances of the first memory cell, the second memory cell, the third memory cell, and the fourth memory cell, to individually program the first memory cell, the second memory cell, the third memory cell, and the fourth memory cell.

3. The memory system of claim 2, wherein the memory controller is configured to sense a current through the second select line according to a parallel resistance of i) a series resistance of the first memory cell and the second memory cell, and ii) a series resistance of the third memory cell and the fourth memory cell to read a multi-level data stored by the first memory cell, the second memory cell, the third memory cell, and the fourth memory cell.

4. The memory system of claim 1, wherein the first word line and the second word line extend along a first direction, wherein the first select line, the second select line, and the third select line extend along a second direction traversing the first direction.

5. The memory system of claim 1,
wherein the first memory cell is coupled between the first select line and a first bit line,
wherein the second memory cell is coupled between the first bit line and the second select line,
wherein the third memory cell is coupled between the second select line and a second bit line, and
wherein the fourth memory cell is coupled between the second bit line and the third select line.

6. The memory system of claim 5, further comprising:
a memory controller configured to apply one or more voltages to the first bit line and the second bit line to individually program the first memory cell, the second memory cell, the third memory cell, and the fourth memory cell.

7. The memory system of claim 6, wherein the memory controller is configured to electrically float the first bit line and the second bit line to read a multi-level data stored by the first memory cell, the second memory cell, the third memory cell, and the fourth memory cell.

8. The memory system of claim 7,
wherein the first word line and the second word line extend along a first direction,
wherein the first select line, the second select line, and the third select line extend along a second direction traversing the first direction, and
wherein the first bit line and the second bit line extend along the second direction.

9. The memory system of claim 1, further comprising:
a fifth memory cell and a sixth memory cell coupled to each other in series between the first select line and the second select line; and
a seventh memory cell and an eighth memory cell coupled to each other in series between the second select line and the third select line.

10. The memory system of claim 9, further comprising:
a memory controller to:
sense a first current through the second select line according to a parallel resistance of i) a series resistance of the first memory cell and the second memory cell, and ii) a series resistance of the third memory cell and the fourth memory cell to read a first multi-level data stored by the first memory cell, the second memory cell, the third memory cell, and the fourth memory cell, and
sense a second current through the second select line according to a parallel resistance of i) a series resistance of the fifth memory cell and the sixth memory cell, and ii) a series resistance of the seventh memory cell and the eighth memory cell to read a second multi-level data stored by the fifth memory cell, the sixth memory cell, the seventh memory cell, and the eighth memory cell.

11. A memory system comprising:
a first memory cell and a second memory cell coupled to each other between a first select line and a second select line;
a third memory cell and a fourth memory cell coupled to each other between the second select line and a third select line; and
a memory controller configured to individually set resistances of the first memory cell, the second memory cell, the third memory cell, and the fourth memory cell, to individually program the first memory cell, the second memory cell, the third memory cell, and the fourth memory cell;
wherein the first to third select lines are in parallel with one another;
wherein the first memory cell and the third memory cell are gated by a first word line, and the second memory cell and the fourth memory cell are gated by a second word line; and
wherein each of the first to fourth memory cells includes a ferroelectric field-effect transistor (FeFET).

12. The memory system of claim 11, wherein the memory controller is configured to sense a current through the second select line according to a parallel resistance of i) a series resistance of the first memory cell and the second memory cell, and ii) a series resistance of the third memory cell and the fourth memory cell to read a multi-level data stored by the first memory cell, the second memory cell, the third memory cell, and the fourth memory cell.

13. The memory system of claim 11, wherein the first word line and the second word line extend along a first direction, wherein the first select line, the second select line, and the third select line extend along a second direction traversing the first direction.

14. The memory system of claim 11,
wherein the first memory cell is coupled between the first select line and a first bit line,
wherein the second memory cell is coupled between the first bit line and the second select line,
wherein the third memory cell is coupled between the second select line and a second bit line, and
wherein the fourth memory cell is coupled between the second bit line and the third select line.

15. The memory system of claim 11, wherein the memory controller is further configured to apply one or more voltages to the first bit line and the second bit line to individually program the first memory cell, the second memory cell, the third memory cell, and the fourth memory cell.

16. The memory system of claim 15, wherein the memory controller is further configured to electrically float the first bit line and the second bit line to read a multi-level data stored by the first memory cell, the second memory cell, the third memory cell, and the fourth memory cell.

17. The memory system of claim 11, further comprising:
a fifth memory cell and a sixth memory cell coupled to each other in series between the first select line and the second select line; and
a seventh memory cell and an eighth memory cell coupled to each other in series between the second select line and the third select line.

18. The memory system of claim 17, wherein the memory controller is further configured to:
sense a first current through the second select line according to a parallel resistance of i) a series resistance of the first memory cell and the second memory cell, and ii) a series resistance of the third memory cell and the fourth memory cell to read a first multi-level data stored by the first memory cell, the second memory cell, the third memory cell, and the fourth memory cell, and
sense a second current through the second select line according to a parallel resistance of i) a series resistance of the fifth memory cell and the sixth memory cell, and ii) a series resistance of the seventh memory cell and the eighth memory cell to read a second multi-level data stored by the fifth memory cell, the sixth memory cell, the seventh memory cell, and the eighth memory cell.

19. A memory system comprising:
a first memory cell and a second memory cell coupled to each other between a first select line and a second select line;
a third memory cell and a fourth memory cell coupled to each other between the second select line and a third select line; and
a memory controller configured to individually set resistances of the first memory cell, the second memory cell, the third memory cell, and the fourth memory cell, to individually program the first memory cell, the second memory cell, the third memory cell, and the fourth memory cell;
wherein the first to third select lines are in parallel with one another;
wherein the first memory cell and the third memory cell are gated by a first word line, and the second memory cell and the fourth memory cell are gated by a second word line; and
wherein each of the first to fourth memory cells includes a ferroelectric field-effect transistor (FeFET);
wherein the first word line and the second word line extend along a first direction, wherein the first select line, the second select line, and the third select line extend along a second direction traversing the first direction.

20. The memory system of claim 19, wherein the memory controller is configured to sense a current through the second select line according to a parallel resistance of i) a series resistance of the first memory cell and the second memory cell, and ii) a series resistance of the third memory cell and the fourth memory cell to read a multi-level data stored by the first memory cell, the second memory cell, the third memory cell, and the fourth memory cell.

* * * * *